United States Patent
Rowell et al.

(10) Patent No.: US 12,276,689 B2
(45) Date of Patent: Apr. 15, 2025

(54) MEASUREMENT SYSTEM AND METHOD FOR TESTING AN OBJECT

(71) Applicant: Rohde & Schwarz GmbH & Co. KG, Munich (DE)

(72) Inventors: Corbett Rowell, Munich (DE); Johannes Steffens, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 163 days.

(21) Appl. No.: 18/155,913

(22) Filed: Jan. 18, 2023

(65) Prior Publication Data

US 2024/0241165 A1   Jul. 18, 2024

(51) Int. Cl.
*G01R 29/10* (2006.01)
*G01R 29/08* (2006.01)

(52) U.S. Cl.
CPC ....... *G01R 29/105* (2013.01); *G01R 29/0821* (2013.01); *G01R 29/0871* (2013.01)

(58) Field of Classification Search
CPC .............. G01R 29/105; G01R 29/0821; G01R 29/0871
See application file for complete search history.

(56) References Cited

U.S. PATENT DOCUMENTS

| | | | | |
|---|---|---|---|---|
| 5,134,405 A * | 7/1992 | Ishihara | ............... | H05K 9/0001 342/4 |
| 6,784,670 B1 * | 8/2004 | Meloling | ................. | H01P 1/26 343/703 |
| 2009/0091335 A1 * | 4/2009 | Kim | ....................... | G01N 27/04 324/633 |
| 2010/0007356 A1 * | 1/2010 | Crain | ................. | G01R 29/0835 324/627 |
| 2014/0285373 A1 * | 9/2014 | Kuwahara | ............. | H01Q 21/08 342/27 |
| 2018/0108187 A1 * | 4/2018 | Kosubek | ................ | G07C 5/006 |
| 2021/0247431 A1 * | 8/2021 | Maruo | ............... | G01R 29/0871 |
| 2024/0243469 A1 * | 7/2024 | Harkins | ................... | H01Q 3/34 |

OTHER PUBLICATIONS

Yener, S.C. and O. Cerezci, "Material Analysis and Application for Radio Frequency Electromagnetic Wave Shielding," ACTA Physica Polonica A; vol. 129:No. 4, 2016; pp. 635-638.
Savi, P. et al., "Shielding Effectiveness Measurements of Drywall Panel Coated with Biochar Layers," Electronics 2022, 11, 2312 <https://doi.org/10.3390/electronics11152312>.

* cited by examiner

*Primary Examiner* — Akm Zakaria
(74) *Attorney, Agent, or Firm* — CHRISTENSEN O'CONNOR JOHNSON KINDNESS PLLC

(57) ABSTRACT

The present disclosure relates to a measurement system for testing an object, including an anechoic chamber assembly with a first chamber portion and a second chamber portion. An intermediate shared wall is located between the chamber portions that encompass a first space and a second space. The intermediate shared wall has a first surface orientated towards the first space and a second surface orientated towards the second space. The intermediate shared wall has an opening that provides a passage between the spaces. The surfaces include absorber material. Inner walls of the chamber portions comprise absorber material. The opening in the intermediate shared wall defines a mounting portion for the object. Further, a method of testing an object by using the measurement system is described.

20 Claims, 3 Drawing Sheets

MEASUREMENT SYSTEM AND METHOD FOR TESTING AN OBJECT

FIELD OF THE DISCLOSURE

Embodiments of the present disclosure generally relate to a measurement system for testing an object. Further, embodiments of the present disclosure relate to a method of testing an object by using a measurement system.

BACKGROUND

In the state of the art, measurement systems are known for testing a shielding effectiveness and/or dielectric properties of a certain object, for instance a housing part of an electronic device (also called: device under test) like a sidewall.

For testing the shielding effectiveness of the object at higher frequencies, e.g. frequencies above 3 GHz, a probe would be placed inside the device under test comprising the object to be tested.

This however raises different problems as the enclosure/housing of the device under test is typically made of a metal, thereby generating multi-path scattering. Further, the boundaries of the enclosure are typically located within the near field of the measurement antenna, thereby causing high measurement errors.

For testing dielectric properties of the object, it is known to use narrow-band high-Q resonators, namely resonators having a high Q factor that describes how underdamped the resonator is. However, the high-Q resonators known are narrow-band such that either a mechanically tunable resonator or a plurality of individual resonators is required, resulting in an expensive measurement system anyway.

Accordingly, there is a need for a measurement system that can be used for testing an object in a reliable and cost-efficient manner, particularly the shielding effectiveness and the dielectric properties of the object.

SUMMARY

Embodiments of the present disclosure relate to a measurement system for testing an object, for instance the shielding effectiveness and the dielectric properties of the object. In an embodiment, the measurement system comprises an anechoic chamber assembly with a first chamber portion and a second chamber portion. The first chamber portion encompasses a first space. The second chamber portion encompasses a second space. An intermediate shared wall is located between the first chamber portion and the second chamber portion. The intermediate shared wall has a first surface orientated towards the first space and a second surface orientated towards the second space. The intermediate shared wall has an opening that provides a passage between the first space and the second space. The first surface and the second surface both comprise absorber material. Inner walls of the first chamber portion and inner walls of the second chamber portion comprise absorber material. The opening in the intermediate shared wall defines a mounting portion for the object.

The main idea is to provide a measurement system that can be used for testing the object in a cost-efficient and reliable manner in order to obtain information concerning the shielding effectiveness and/or the dielectric properties of the object. For this purpose, the measurement system comprises two separately formed chamber portions, namely the first chamber portion and the second chamber portion, which are separated from each other by the intermediate shared wall. The intermediate shared wall is a wall that delimits the first space as well as the second space simultaneously. This intermediate shared wall has the opening that is used for accommodating the object to be tested.

Since the inner walls of the first chamber portion, the inner walls of the second chamber portion as well as both surfaces of the intermediate shared wall comprise absorber material, multi-path reflections within an interior space of the anechoic chamber assembly can be avoided effectively, which results in reliable test results. In other words, the opening located within the intermediate shared wall only faces absorber material, as all inner walls of the chamber portions and the surfaces of the intermediate shared wall facing the first space and the second space comprise the absorber material. For instance, the inner walls and the surfaces of the intermediate shared wall are covered by the absorber material, for instance coated.

The first surface of the intermediate shared wall is opposite to the second surface. In other words, the intermediate shared wall may relate to a (metal) plate having two opposite surfaces, namely the first surface as well as the second surface.

Generally, the intermediate shared wall with the respective absorber material located on its opposite surfaces, namely the first surface and the second surface, corresponds to a sandwich structure having a first layer of absorber material (first absorber layer), a material layer and a second layer of absorber material (second absorber layer). The material layer is sandwiched between the absorber layers. The material layer may be a metal layer, as the intermediate shared wall may correspond to a metal plate.

In any case, the intermediate shared wall is sealed to all sides of the anechoic chamber assembly, as its surfaces comprise absorber material as well as adjacent surfaces of the chamber portions, which are provided by the inner walls.

In general, the object to be tested may be a housing part such as a sidewall, a ceiling wall or a bottom wall. Moreover, the object may also relate to the entire housing/enclosure. Thus, the object to be tested may be made of a dielectric material, e.g. a metal.

The purpose of the measurement system is to test the shielding effectiveness and/or the dielectric properties of the respective object.

In a testing state, the object may be located within the mounting portion that is defined by the opening within the intermediate shared wall. Hence, the opening may be completely sealed by the object to be tested.

Consequently, the entire interior space of the anechoic chamber assembly is delimited either by the absorber material or the object to be tested. This ensures that the object can be tested in a reliable manner, as multi-path reflections can be avoided effectively.

Since it is not necessary to provide several high-Q resonators for testing the characteristics of the object, the respective tests of the object can be done in a cost-efficient manner.

Contrary to the state of the art, no multipath reflections and/or standing waves occur that have negative effects on the testing.

An aspect provides that all surfaces delimiting the first space and all surfaces delimiting the second space comprise, for example, absorber material. In some embodiments, the first chamber portion and/or the second chamber portion may be cup-shaped. In case both chamber portions are cup-shaped, the chamber portions may be orientated towards each other via their respective open side. The inner walls of the (cup-shaped) chamber portions comprise the absorber material. The intermediate shared wall is located between the (cup-shaped) chamber portions, wherein the intermediate shared wall also comprises absorber material on its surfaces, namely the surfaces being opposite to each other. These surfaces also delimit the first space and the second space respectively. Consequently, all surfaces delimiting the respective spaces comprise absorber material such that the entire spaces, namely the first space and the second space, are sealed by the absorber material. In other words, the chamber portions are covered completely by the absorber material. This setup ensures that multi-path reflections can be avoided effectively, thereby reducing measurement errors.

Another aspect provides that the opening is located, for example, in an area of the intermediate shared wall that is distanced from edges of the intermediate shared wall. The opening is not located at an edge of the intermediate shared wall, but in an area that is surrounded by material of the intermediate shared wall. Accordingly, the opening is also surrounded by absorber material that is located on the first surface and the second surface of the intermediate shared wall.

A further aspect provides that the opening is located, for example, in the center of the intermediate shared wall. Therefore, the intermediate shared wall is established in a symmetric manner. This ensures that the intermediate shared wall can be flipped (by 180°) without changing the geometric characteristics of the intermediate shared wall and, thus, the entire anechoic chamber assembly. This simplifies assembling the entire anechoic chamber assembly, e.g. connecting the chamber portions with each other and disposing the intermediate shared wall between the chamber portions.

Further, the intermediate shared wall may be located in the center of the anechoic chamber assembly such that the first space and the second space are sized equally. Accordingly, both chamber portions are similar wherein they are separated from each other by the intermediate shared wall. Consequently, the first chamber portion and the second chamber portion correspond to a first chamber half and a second chamber half, as the entire interior space of the anechoic chamber assembly is split into two halves by the intermediate shared wall, wherein these halves correspond to the first space and the second space.

Another aspect provides that at least one transmission antenna is located, for example, within the first chamber portion or the second chamber portion. The at least one transmission antenna is capable of transmitting test signals for testing the characteristics of the object. The at least one transmission antenna may be mounted on an inner wall of the respective chamber portion.

The at least one transmission antenna is orientated towards the opening in the intermediate shared wall. Any test signal transmitted by the at least one transmission antenna is directed towards the opening, thereby ensuring that the test signal can pass through the passage provided by the opening in order to reach the respective other chamber portion.

Generally, the measurement system may comprise several transmission antennas that are all directed towards the opening.

The respective orientation of the at least one transmission antenna, for example the one of the several transmission antennas, may be rectangular or inclined with respect to the intermediate shared wall. The inclined orientation relates to an angle that differs from a 90° orientation (rectangular) between the (main direction of the) transmission antenna and the intermediate shared wall.

According to a further aspect, at least one reception antenna is located, for example, within the first chamber portion or the second chamber portion. The at least one reception antenna is capable of receiving a test signal transmitted by the transmission antenna. In some embodiments, the at least one reception antenna is capable of receiving a test signal that has been transmitted by the transmission antenna and passed the passage provided by the opening in the intermediate shared wall.

In some embodiments, the at least one reception antenna is orientated towards the opening in the intermediate shared wall. This ensures that a signal passing the passage provided by the opening can be received by the at least one reception antenna. The measurement system may also comprise several reception antennas that are all orientated towards the opening.

The orientation of the respective reception antenna may be inclined or rectangular with respect to the intermediate shared wall. As indicated above, the inclined orientation relates to an angle that differs from a 90° orientation (rectangular) between the (main direction of the) reception antenna and the intermediate shared wall For instance, at least one transmission antenna is located within the first chamber portion wherein at least one reception antenna is located within the second chamber portion. The at least one transmission antenna and the at least one reception antenna are orientated towards the opening in the intermediate shared wall. The at least one transmission antenna transmits a test signal that travels through the first space and the passage defined by the opening in the intermediate shared wall in order to enter the second chamber portion. The test signal further passes through the second space while being received by the at least one reception antenna located in the second chamber portion.

The measurement system may comprise a signal generation equipment and a signal analysis equipment. The signal generation equipment is connected with the at least one transmission antenna, whereas the signal analysis equipment is connected with the at least one reception antenna. Accordingly, the measurement system is enabled to generate the test signal to be transmitted via the at least one transmission antenna. In addition, the measurement system also comprises a signal analysis equipment that is used to analyze the test signal received by the at least one reception antenna. Therefore, the characteristics of the object to be tested can be determined appropriately by the signal analysis equipment.

In general, the signal generation equipment is enabled to generate a test signal at different frequencies, wherein a frequency range is covered that relates to a broadband signal. In some embodiments, the test signal may have a frequency higher than 3 GHz. However, the test signal generated by the signal generator equipment may also comprise a frequency lower than 3 GHz.

Generally, the measurement system is enabled to measure the shielding effectiveness and/or properties of the objected to be tested at frequencies above 3 GHz, but also below 3 GHz.

Another aspect provides that the measurement system comprises, for example, a mounting adapter to be placed into the opening. The mounting adapter is used in case the object to be tested is smaller than the opening. The mounting adapter is placed into the opening in order to ensure that the opening is completely sealed by the mounting adapter and the object to be tested. Hence, no leakage is possible once the (small) objected to be tested together with the mounting adapter are inserted.

The mounting adapter itself may also comprise absorber material on its surfaces orientated towards the first space and the second space. Again, this ensures that no multi-path reflections take place.

For instance, the first chamber portion and the second chamber portion are separately formed anechoic chambers that are connected with each other, thereby establishing the anechoic chamber assembly. The separately formed anechoic chambers may be modified in that a ceiling wall and/or a bottom wall are/is replaced by the intermediate shared wall, thereby establishing the anechoic chamber assembly having the intermediate shared wall with the opening, which is interposed between the first chamber portion and the second chamber portion.

Embodiments of the present disclosure also relate to a method of testing an object by using the measurement system defined above. In an embodiment, the method comprises the steps of: transmitting a first test signal by at least one transmission antenna, receiving the first test signal by at least one reception antenna, wherein the first test signal has passed the opening in the intermediate shared wall, thereby obtaining reference data, placing the object within the anechoic chamber assembly such that the object blocks the opening in the intermediate shared wall, transmitting a second test signal by the at least one transmission antenna, receiving the second test signal by the at least one reception antenna, wherein the second test signal has passed the object that blocks the opening in the intermediate shared wall, thereby obtaining measurement data, and processing the reference data and the measurement data in order to characterize the object.

Accordingly, two different measurements are done, namely in an unoccupied state in which no object is placed in the opening and in an occupied state in which the object is placed in the opening. The respective data obtained by the different setups is processed in order to characterize the object, as a deviation of the obtained data associated with the different setups is caused by the object located in the opening, as this is the only deviation between the different setups.

An aspect provides that the reference data and the measurement data are compared, for example, with each other, thereby gathering information of the influence of the object. The respective comparison may relate to a subtraction of the different data obtained. For instance, the measurement data is subtracted from the reference data (or vice versa) in order to determine the influence of the object to be tested. Put differently, a transmission value for the unoccupied opening (reference setup) and a transmission value for the occupied opening (measurement setup) are determined, wherein the influence of the occupation by the object is calculated when subtracting the respective transmission values.

For instance, shielding characteristics of the object are determined when processing the reference data and the measurement data. In other words, a final shielding effectiveness value or a dielectric property of the material of the object to be tested is determined when processing the respective data obtained by the different setups.

The at least one transmission antenna and/or the at least one reception antenna may be orientated with respect to the intermediate shared wall at an angle different to 90°, namely the main direction of the respective antenna is inclined by an angle different to 90° with respect to the intermediate shared wall. Hence, angular properties of the object can be determined.

Further, multiple reception antennas may be provided wherein reception data obtained from the multiple reception antennas is processed to calculate diffraction characteristics of the object. Hence, the diffraction characteristics of the object can be determined in an efficient manner.

A further aspect provides that, prior to transmitting the second test signal, a mounting adapter is placed, for example, into the opening, wherein the object is located on the mounting adapter. This ensures that the opening is blocked completely in case the object to be tested is smaller than the opening. The complete blocking ensures reliable measurements with reduced measurement errors.

Generally, the several transmission antennas and/or the several reception antennas may be arranged in an antenna array. The respective antenna array points towards the opening. Accordingly, the test signal is transmitted towards the opening or the object located within the opening. Similarly, the test signal passing the opening or the object located within the opening is received by the respective antenna array as it points towards the opening.

In some embodiments, the at least one (reception and/or transmission) antenna pointing towards the opening may point towards the opening directly (shortest distance like rectangular orientation) or at an inclined angle.

Accordingly, two adjacent chamber portions, for example two anechoic chambers, are separated by the intermediate shared wall that has the opening. The opening corresponds to a window, as it provides the passage between the spaces encompassed by the chamber portions. Both chamber portions have absorber material at their inner walls to prevent multi-path reflections. In addition, at least one antenna is located within each chamber portion, for example a reception antenna and a transmission antenna. The objet to be tested, for instance a shielding wall or a dielectric material, is placed in the opening to measure the transmission characteristics, namely by transmitting the test signal by the at least one transmission antenna to the at least one reception antenna. Hence, measurement data, for example a measurement value like a transmission value, is obtained which can be used for calculating the shielding effectiveness value and/or the dielectric properties of the object to be tested. For instance, the respective value obtained is subtracted from a reference value obtained when performing the same measurement for an unoccupied opening, e.g. an open window. This means that the reference measurement is done by not placing the object to be tested in the opening.

As indicated above, the intermediate shared wall is encompassed by absorber material completely. In other words, the intermediate shared wall is sealed to all sides of the anechoic chamber assembly.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Similarly, any steps described herein may be interchangeable with other steps, or combinations of steps, in order to achieve the same or substantially similar result. Moreover, some of the method steps can be carried serially or in parallel, or in any order unless specifically expressed or understood in the context of other method steps.

Figure 1:
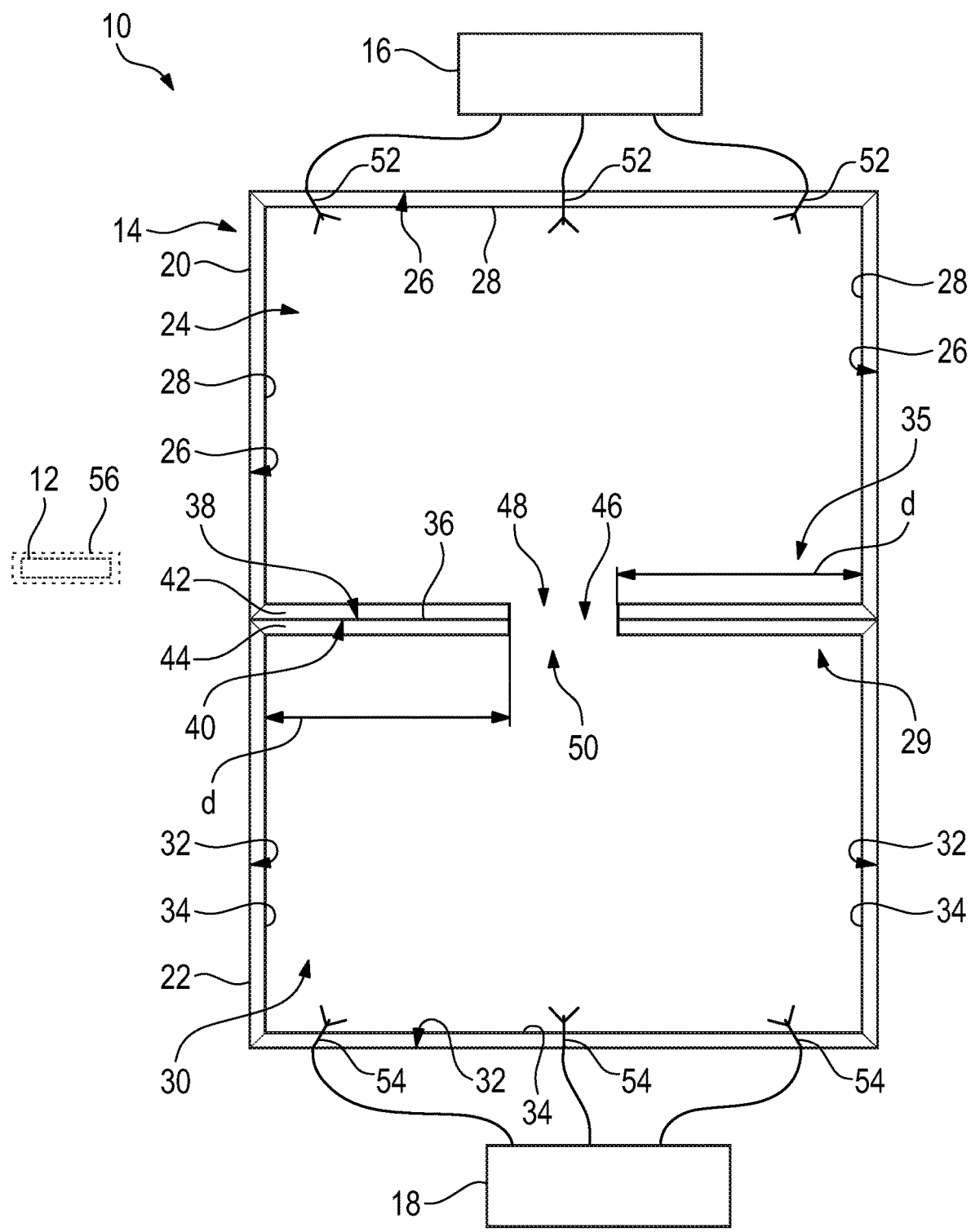
FIG. 1 schematically shows a schematic cross-sectional view of an embodiment of the measurement system according to the present disclosure.

In FIG. 1, a measurement system 10 for testing an object 12 is shown. The measurement system 10 comprises an anechoic chamber assembly 14 as well as signal generation equipment 16 and signal analysis equipment 18. The signal generation equipment 16 as well as the signal analysis equipment 18 may be located separately with respect to the anechoic chamber assembly 14 as shown in FIG. 1, namely outside of any housing parts of the anechoic chamber assembly 14. Alternatively, the signal generation equipment 16 and/or the signal analysis equipment 18 may be located within the anechoic chamber assembly 14, e.g. within an enclosure/housing of the anechoic chamber assembly 14.

In general, the anechoic chamber assembly 14 comprises a first chamber portion 20 and a second chamber portion 22, which are connected with each other. In some embodiments, the chamber portions 20, 22 are stacked on top of each other.

The first chamber portion 20 encompasses a first space 24 by inner walls 26 that each comprise an absorber material 28. The absorber material 28 may be mechanically fixed and/or chemically fixed to the inner walls 26, for instance coated on the inner walls 26. In the shown embodiment, the first chamber portion 20 is cup-shaped, as it generally has one open side 29 that faces the second chamber portion 22.

The second chamber portion 22 encompasses a second space 30 by inner walls 32. The inner walls 32 of the second chamber portion 22 also comprise absorber material 34. The absorber material 34 may also be mechanically fixed and/or chemically fixed to the inner walls 32, for instance coated on the inner walls 32. In the shown embodiment, the second chamber portion 22 is also cup-shaped, as it generally has one open side 35 that faces the first chamber portion 20.

Accordingly, all inner surfaces 26, 32 of the chamber portions 20, 22 comprise at their inner surfaces absorber material 28, 34, namely the surfaces facing the respective space 24, 30 encompassed by the inner walls 26, 32.

As shown in FIG. 1, the (cup-shaped) chamber portions 20, 22 are placed or stacked on each other such that their open sides 29, 35 are opposing each other. However, an intermediate shared wall 36 is located between the first chamber portion 20 and the second chamber portion 22. In other words, the first space 24 and the second space 30 both are delimited by the same intermediate shared wall 36.

As shown in FIG. 1, the intermediate shared wall 36 is located in the center of the anechoic chamber assembly 12 such that the first space 24 and the second space 30 are sized equally. In other words, the chamber portions 20, 22 may be made in a similar manner. Hence, the intermediate shared wall 36 corresponds to a lid for both cup-shaped chamber portions 20, 22 simultaneously, as the intermediate shared wall 36 is assigned to the open sides 29, 35 of the cup-shaped chamber portions 20, 22.

The intermediate shared wall 36 has a first surface 38 that is orientated towards the first space 24. Further, the intermediate shared wall 36 has an opposite second surface 40 that is orientated towards the second space 30. The different surfaces 38, 40 of the intermediate shared wall 36 both comprise absorber material 42, 44 such that all surfaces orientated towards the first space 24 and the second space 30 comprise absorber material 28, 34, 42, 44. Hence, the spaces 24, 30 are (mainly) surrounded by absorber material.

In addition, the intermediate shared wall 36 has an opening 46 that provides a passage 48 between the first space 24 and the second space 30. The opening 46 is located in an area of the intermediate shared wall 36 that is distanced from edges of the intermediate shared wall 36 by a distance d to both edges as shown in FIG. 1. Hence, the opening 46 is located in the center of the intermediate shared wall 36. The opening 46 defines a mounting portion 50 for the object 12 to be tested by the measurement system 10 as will be explained hereinafter in more detail.

The measurement system 10 also comprises at least one transmission antenna 52, for example several transmission antennas 52, e.g. a transmission antenna array, as well as at least one reception antenna 54, for example several reception antennas 54, e.g. a reception antenna array. The at least one transmission antenna 52 is connected with the signal generation equipment 16, whereas the reception antenna 54 is connected with the signal analysis equipment 18.

In the shown embodiment, the at least one transmission antenna 52 is located in the first chamber portion 20, for example at an inner wall 26 of the first chamber portion 20, whereas the at least one reception antenna 54 is located in the second chamber portion 22, for example at an inner wall 32 of the second chamber portion 22. The at least one transmission antenna 52 as well as the at least one reception antenna 54 both are orientated towards the opening 46 such that a test signal transmitted by the at least one transmission antenna 52 travels through the first chamber portion 20, the opening 26 or the passage 48 between the chamber portions 20, 22 as well as the second chamber portion 22. Finally, the respective test signal is received by the at least one reception antenna 54. As shown in FIG. 1, the respective antennas 52, 54 may point towards the opening differently, namely in a direct manner (rectangular orientation) as shown for the middle antennas 52, 54 or in an inclined manner as shown for the outer antennas 52, 54.

Figure 2:
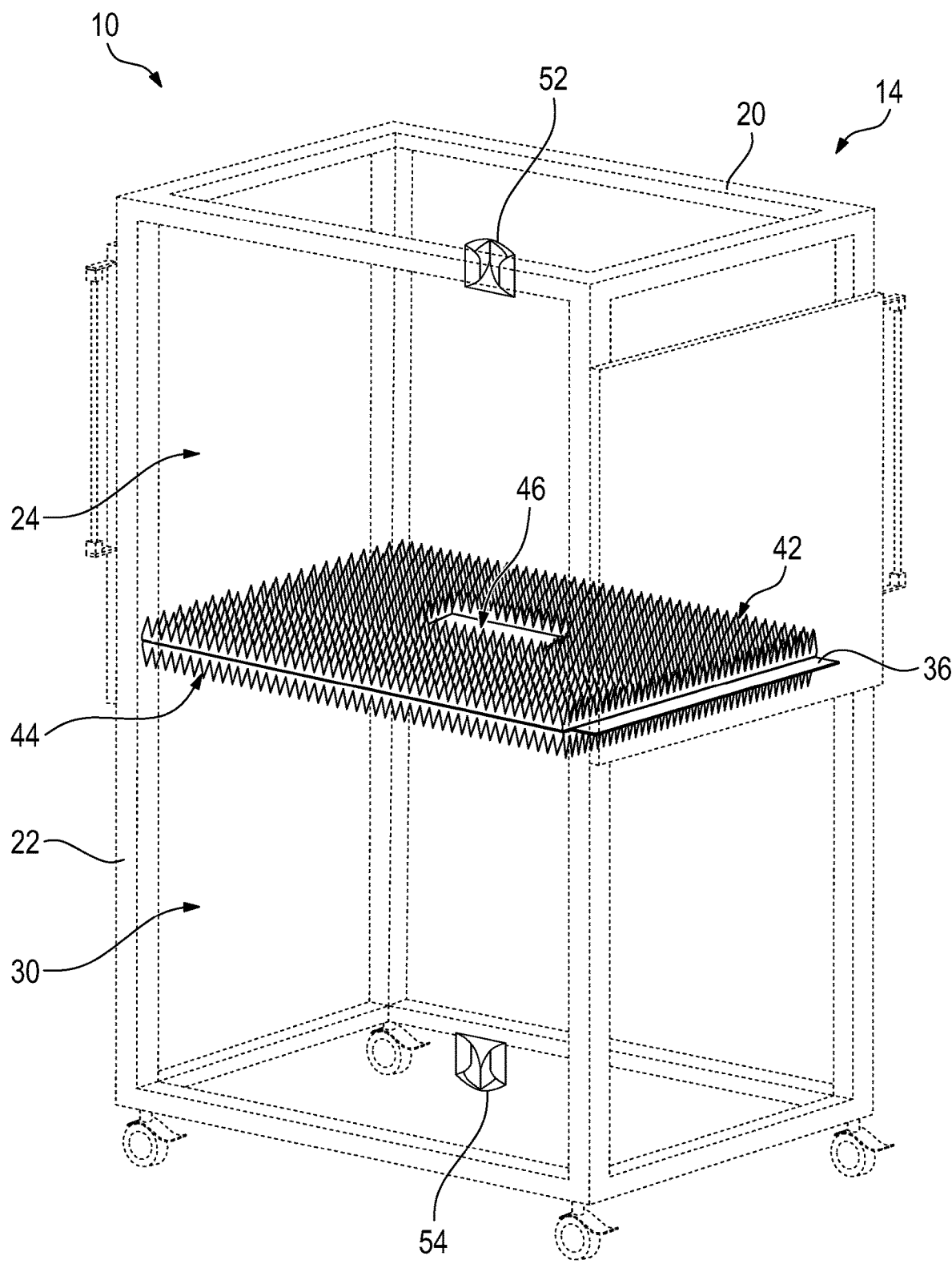
FIG. 2 shows a schematic perspective view of another embodiment of the measurement system according to the present disclosure.
Figure 3:
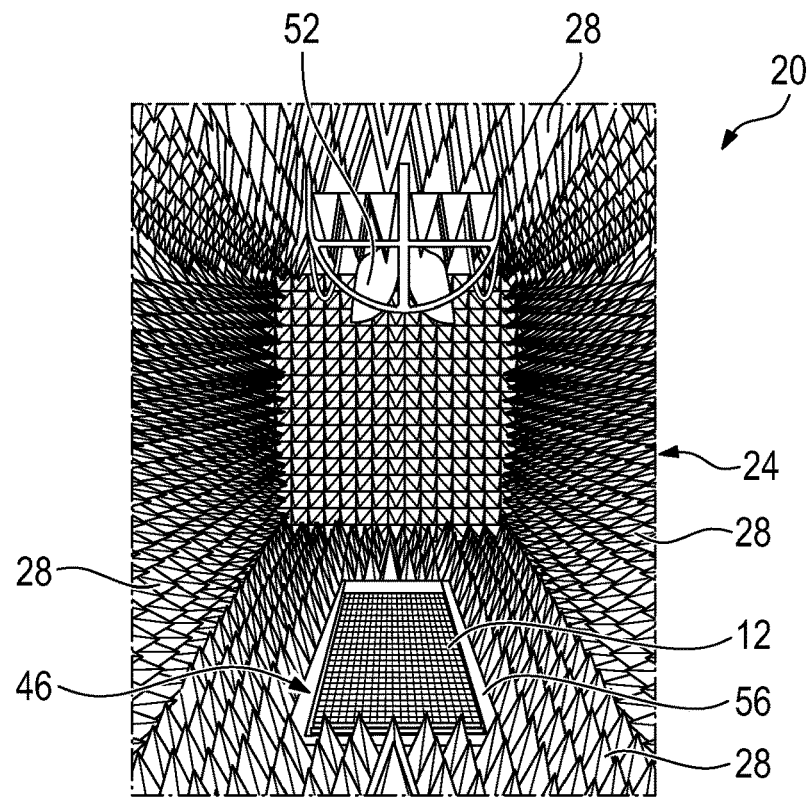
FIG. 3 shows another perspective view on the first chamber portion of the measurement system shown in FIG. 2.
Figure 4:
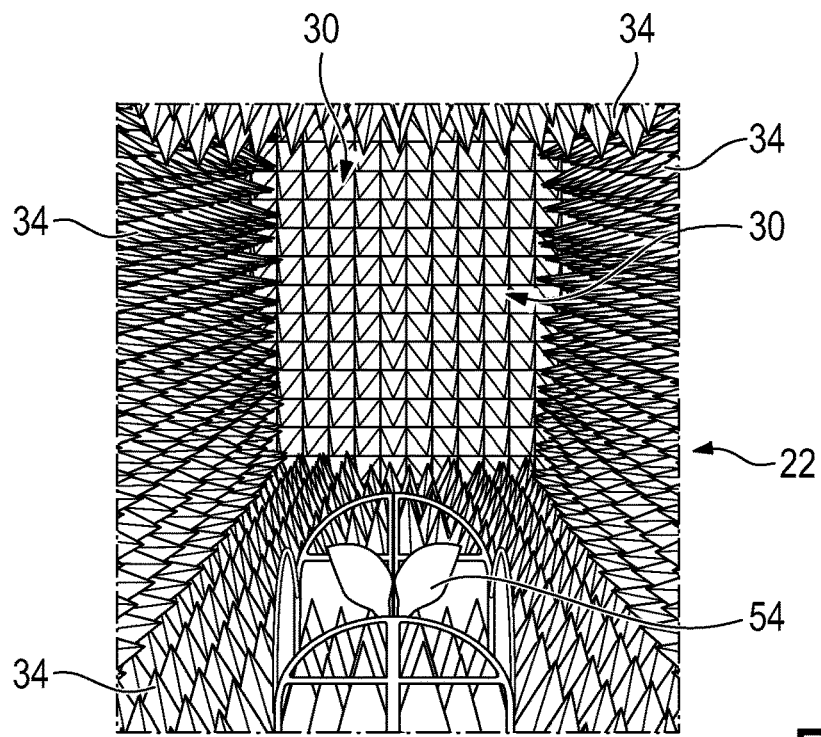
FIG. 4 shows another perspective view on the second chamber portion of the measurement system shown in FIG. 2.

In FIGS. 2 to 4, another embodiment of the measurement system 10 is shown, wherein only one transmission antenna 52 and one reception antenna 54 are provided. These antennas 52, 54 are directly orientated towards the opening 46. Hence, a 90° angle is provided between the plane of the intermediate shared wall 36 and the main direction(s) of these antennas 52, 54.

In FIG. 2, the sandwiched structure of the intermediate shared wall 36 having the absorber material 42, 44 at its opposite surfaces 38, 40 as well as the antennas 52, 54 are highlighted, whereas the structure of the chamber portions 20, 22 is partly faded out for better representation purposes. The structure of the chamber portions 20, 22, for example the inner walls 26, 32 covered by the absorber materials 28, 34, is illustrated in a more illustrative manner in FIGS. 3 and 4.

In some embodiments, the opening 46 is located in the center of the intermediate shared wall 36, as it circumference is distanced to opposite edges by the same distance, as shown in FIG. 3.

For testing the object 12, a reference measurement is done in order to obtain reference data. The reference measurement is performed without the object 12 to be tested being located within the anechoic chamber assembly 14, e.g. the state shown in FIG. 1.

Hence, a first test signal is generated by the signal generation equipment 16, wherein the first test signal is transmitted by the at least one transmission antenna 52 that is orientated towards the opening 46 within the intermediate shared wall 36. The first test signal transmitted by the at least one transmission antenna 52 travels through the first space 24, the passage 48 provided by the opening 46 and the second space 30. Then, the first test signal is received by the at least one reception antenna 54. The first test signal received is forwarded to the signal analysis equipment 18, thereby obtaining reference data. This completes the reference measurement.

Then, the object 12 to be tested is placed within the anechoic chamber assembly 14 such that the object 12 blocks the opening 46 in the intermediate shared wall 36. This state is shown in FIG. 3. In case the object 12 to be tested is smaller than the opening 46, a mounting adapter 56 is provided as shown in FIGS. 1 and 3. The mounting adapter 56 has exactly the same size as the opening 46, thereby ensuring that the mounting adapter 56 can be located within the opening 46, thereby completely sealing the opening 46. The mounting adapter 56 is also enabled to support the object 12 to be tested. For instance, the object 12 is located on the mounted adapter 56. In case the object 12 to be tested is not smaller than the opening 46, the object 12 may be directly placed into the opening 46.

In any case, the object 12 is placed within the anechoic chamber assembly 14 (via the mounted adapter 56) for testing purposes, wherein the object 12 blocks the opening 46 in the intermediate shared wall 36 (completely or partly). In all scenarios, the opening 46 is completely sealed when the object 12 is placed within the anechoic chamber assembly 14, namely either by the object 12 itself solely or by the object 12 and the mounting adapter 56.

Once the object 12 is installed in the anechoic chamber assembly 14, for example the opening 46, the signal generation equipment 16 generates a second test signal that is transmitted via the at least one transmission antenna 52 towards the opening 46. The second test signal may be equal to the first test signal with regard to its characteristics. Thus, the second test signal only differs from the first test signal with regard to its generation/transmission time.

The second test signal transmitted travels through the first space 24, the object 12 to be tested that is located within the opening 46 as well as the second space 30. Then, the second test signal is received by the at least one reception antenna 54. Since the second test signal has passed the object 12 that blocks the opening 46 in the intermediate shared wall 36, the characteristics of the second test signal may be modified due to the object 12 located within the opening 46.

The second test signal received by the at least one reception antenna 54 is forwarded to the signal analysis equipment 18 for obtaining measurement data that may differ from the reference data due to the influence of the object 12 located within the opening 46. Accordingly, the signal analysis equipment 18 may process the reference data as well as the measurement data in order to characterize the object 12, for example to determine any shielding characteristics and/or dielectric properties of the object 12.

For instance, the reference data and the measurement data may be compared with each other, thereby gathering information on the influence of the object 12. The respective comparison may correspond to a subtraction.

As shown in FIG. 1, several reception antennas 54 are provided such that diffraction characteristics of the object 12 may be determined when processing the reference data and the measurement data.

Since all surfaces orientated towards the interior space of the anechoic chamber assembly 14 are covered by or comprise absorber material, multi-path reflections within the interior space are avoided effectively. This ensures that the characteristics of the object 12 can be determined in a reliable manner.

Certain embodiments disclosed herein utilize circuitry (e.g., one or more circuits) in order to implement protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof.

In an embodiment, circuitry includes hardware circuit implementations (e.g., implementations in analog circuitry, implementations in digital circuitry, and the like, and combinations thereof). In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation comprising one or more processors or portions thereof and accompanying software, firmware, hardware, and the like.

In the foregoing description, specific details are set forth to provide a thorough understanding of representative embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure. Further, it will be appreciated that embodiments of the present disclosure may employ any combination of features described herein.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

Throughout this specification, terms of art may be used. These terms are to take on their ordinary meaning in the art from which they come, unless specifically defined herein or the context of their use would clearly suggest otherwise.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A measurement system for testing an object, the measurement system comprising an anechoic chamber assembly with a first chamber portion and a second chamber portion, wherein the first chamber portion encompasses a first space, wherein the second chamber portion encompasses a second space, wherein an intermediate shared wall is located between the first chamber portion and the second chamber portion, wherein the first chamber portion and the second chamber portion share the intermediate shared wall such that the intermediate shared wall delimits the first space and the second space simultaneously, wherein the intermediate shared wall has a first surface orientated towards the first space and a second surface orientated towards the second space, wherein the first surface and the second surface are on opposite sides of the intermediate shared wall, wherein the intermediate shared wall has an opening that provides a passage between the first space and the second space, wherein the passage is defined by the opening in the intermediate shared wall, wherein the first surface and the second surface both comprise an absorber material, wherein inner walls of the first chamber portion and inner walls of the second chamber portion comprise an absorber material, and wherein the opening in the intermediate shared wall defines a mounting portion for the object.

2. The measurement system according to claim 1, wherein all surfaces delimiting the first space and all surfaces delimiting the second space comprise an absorber material.

3. The measurement system according to claim 1, wherein the opening is located in an area of the intermediate shared wall that is distanced from edges of the intermediate shared wall.

4. The measurement system according to claim 1, wherein the opening is located in the center of the intermediate shared wall.

5. The measurement system according to claim 1, wherein the intermediate shared wall is located in the center of the anechoic chamber assembly such that the first space and the second space are sized equally.

6. The measurement system according to claim 1, wherein at least one transmission antenna is located within the first chamber portion or the second chamber portion.

7. The measurement system according to claim 6, wherein the at least one transmission antenna is orientated towards the opening in the intermediate shared wall.

8. The measurement system according to claim 1, wherein at least one reception antenna is located within the first chamber portion or the second chamber portion.

9. The measurement system according to claim 8, wherein the at least one reception antenna is orientated towards the opening in the intermediate shared wall.

10. The measurement system according to claim 1, wherein at least one transmission antenna is located within the first chamber portion, wherein at least one reception antenna is located within the second chamber portion, and wherein the at least one transmission antenna and the at least one reception antenna are orientated towards the opening in the intermediate shared wall.

11. The measurement system according to claim 1, wherein the measurement system comprises a signal generation equipment and a signal analysis equipment.

12. The measurement system according to claim 1, wherein the measurement system comprises a mounting adapter to be placed into the opening.

13. The measurement system according to claim 1, wherein the first chamber portion and the second chamber portion are separately formed anechoic chambers that are connected with each other, thereby establishing the anechoic chamber assembly.

14. A method of testing an object by using the measurement system according to claim 1, wherein the method comprises:
   transmitting a first test signal by at least one transmission antenna,
   receiving the first test signal by at least one reception antenna, wherein the first test signal has passed the opening in the intermediate shared wall, thereby obtaining reference data,
   placing the object within the anechoic chamber assembly such that the object blocks the opening in the intermediate shared wall,
   transmitting a second test signal by the at least one transmission antenna,
   receiving the second test signal by the at least one reception antenna, wherein the second test signal has passed the object that blocks the opening in the intermediate shared wall, thereby obtaining measurement data, and
   processing the reference data and the measurement data in order to characterize the object.

15. The method of claim 14, wherein the reference data and the measurement data are compared with each other, thereby gathering information of the influence of the object.

16. The method of claim 14, wherein shielding characteristics of the object are determined when processing the reference data and the measurement data.

17. The method of claim 14, wherein the at least one transmission antenna and/or the at least one reception antenna is orientated with respect to the intermediate shared wall at an angle different to 90°.

18. The method of claim 14, wherein multiple reception antennas are provided, and wherein reception data obtained from the multiple reception antennas is processed to calculate diffraction characteristics of the object.

19. The method of claim 14, wherein, prior to transmitting the second test signal, a mounting adapter is placed into the opening, and wherein the object is located on the mounting adapter.

20. A measurement system for testing an object, the measurement system comprising an anechoic chamber assembly with a first chamber portion and a second chamber portion, wherein the first chamber portion encompasses a first space, wherein the second chamber portion encompasses a second space, wherein an intermediate shared wall is located between the first chamber portion and the second chamber portion, wherein the first chamber portion and the second chamber portion share the intermediate shared wall such that the intermediate shared wall delimits the first space and the second space simultaneously, wherein the intermediate shared wall has a first surface orientated towards the first space and a second surface orientated towards the second space, wherein the first surface and the second surface are on opposite sides of the intermediate shared wall, wherein the intermediate shared wall has an opening that provides a passage between the first space and the second space, wherein the passage is defined by the opening in the intermediate shared wall, wherein the first surface and the second surface both comprise an absorber material such that the intermediate shared wall corresponds to a sandwich structure having a metal plate sandwiched between two layers of the absorber material, wherein inner walls of the first chamber portion and inner walls of the second chamber portion comprise an absorber material, and wherein the opening in the intermediate shared wall defines a mounting portion for the object.

* * * * *